United States Patent [19]

Spencer et al.

[11] Patent Number: 5,149,682

[45] Date of Patent: * Sep. 22, 1992

[54] MANUFACTURING METHOD FOR SUPERCONDUCTING CERAMICS AND PRODUCTS THEREOF

[75] Inventors: Nicholas D. Spencer, Washington, D.C.; Wie H. Pan, Columbia; John Rudesill, Baltimore, both of Md.

[73] Assignee: W. R. Grace & Co. -Conn., New York, N.Y.

[ * ] Notice: The portion of the term of this patent subsequent to Mar. 19, 2008 has been disclaimed.

[21] Appl. No.: 155,340

[22] Filed: Feb. 12, 1988

Related U.S. Application Data

[63] Continuation-in-part of Ser. No. 095,083, Sep. 11, 1987, abandoned.

[51] Int. Cl.$^5$ .................. H01L 39/12; C01F 17/00
[52] U.S. Cl. .......................... 505/1; 505/738; 505/780; 505/785
[58] Field of Search ............... 505/1, 737, 738, 779, 505/780, 782, 785

[56] References Cited

U.S. PATENT DOCUMENTS 4,839,339 6/1989 Bunker et al. .

FOREIGN PATENT DOCUMENTS 0287258 10/1988 European Pat. Off. .
0294221 12/1988 European Pat. Off. .
88/10009 12/1988 PCT Int'l Appl. .
88/10235 12/1988 PCT Int'l Appl. .
88/10515 12/1988 PCT Int'l Appl. .

OTHER PUBLICATIONS

Shiyuan et al., "D. C. Susceptability of High Tc Superconductors of Y-Ba-Cu-O", Intl Tenlor Mod Phys vol. 1, No. 2 1987, pp. 592-531
Melling, Peter J., et al., "Powder Preparation and Thermal Properties of 1-2-3 Y Ba Cu Oxide Superconductor", *Cryogenic Eng.*, v. 34, pp. 647-654 (1988), pub. by Plenum Publ. Corp.
Marcilly, C., et al., "Preparation of Highly Dispersed Mixed Oxides and Oxide Solid Solutions by Pyrolysis of Amorphous Organic Precursors", *Jour. Amer. Ceramic Soc.*, 53, pp. 56-57 (Jan. 21, 1970).
Kaneko et al., "On the Precipitation Method for the Preparation of High Tc M-X-Cu-O (M=Ba, Sr, X=La, Y) Systems", Japanese Journal of Applied Physics, vol. 26, No. 5, May, 1987, pp. L734-L735.
Fujiki et al., "Preparation of High Tc-Y-Ba-Cu-O Superconductor Using Colloidol Methods", Jul, 1987, Japanese Journal of Applied Physics, pp. L1159-1160.
J. G. Bednorz and K. A. Mueller, Possible High Tc Superconductivity in the Ba-La-Cu-O System, *Zeit, Phys. B.*, 64, 189-193 (1986).
C. Michel et al., Oxygen intercalation in mixed valence copper oxides related to the perovskites, *Rev. de Chim. Minerale*, t. 21 pp. 407-425 (1984).
Cava, R. J. et al., Bulk Superconductivity at 90°K. in Single-Phase Oxygen Deficient Perovskite $Ba_2YCu_3O_{9-8}$, *Phys. Rev. Lett.*, 58, 1676-1679 (20 Apr. 1988).
Nguyen N., et al., Oxydes Ternaires de Cuivre a Valence Mixte de Type $K_2NiF_4$ Deficitaires en Oxygene: Evolution Progressive d'un Etat Semi-Conducteur vers un Etat Semi-metallique Des Oxydes $La_{x}Sr_{x}$-$CuO_{4-x/2+8}$, *J. Phys. Chem. Solids*, 44, 389-400 (1983).
Nguyen, Ninh, et al., Oxygen Defect $K_2NiF_4$-Type Oxides: The Compounds $La_{2-x}Sr_xCuO_{4-x/2*8}$Jour. solid State Chem., 39, 120-127 (1981).
Shaplygin, I. S. et al., Preparation & Properties of the Cmpds. $Ln_2CuO_4$(Ln=La, Pr, Nd, Sm, Eu, Gd), *Russ. J. Inorg. Chem.*, 24, 1478-1485 (1979) (English).
Hermann, A. M. et al., Melt-processible rare earth-Ba-Cu-O superconductors based on Molten Ba-Cu oxides: *Appl. Phys. Lett.*, 51, 1854-1856 (Nov. 30, 1987).

Primary Examiner—Mark L. Bell
Assistant Examiner—Chris Gallo
Attorney, Agent, or Firm—Steven Capella

[57] ABSTRACT

Superior homogeneity in ceramic materials is achieved by reacting certain soluble metal salts with quaternary ammonium carbonates to form co-precipitated metal carbonates. The precipitate can be recovered and processed to make superconductors. For example, a solution of nitrates of yttrium, barium, and copper are treated with a solution of tetraethyl ammonium carbonate to form co-precipitated carbonates of Y, Ba, Cu. The precipitate is recovered and calcined to form a superconducting material.

16 Claims, No Drawings

MANUFACTURING METHOD FOR SUPERCONDUCTING CERAMICS AND PRODUCTS THEREOF

This application is a continuation-in-part of U.S. patent application Ser. No. 095,083 filed Sep. 11, 1987, abandoned.

RELATED APPLICATION

U.S. Ser. No. 095,084, filed Sep. 11, 1987, now abandoned, Spencer and Cheng discloses and claims spray drying metal salts adapted to the preparation of superconductors.

FIELD OF THE INVENTION

This invention relates to the preparation of superconducting ceramics and more particularly to an improvement in preparing the metal oxide system generically represented by L.M.A.D. where (e.g.) L may be yttrium; M may be barium; A, copper; and D, oxygen.

BACKGROUND OF THE INVENTION

It has long been known that the effective resistivity of certain metals was sometimes substantially eliminated, when the metal was exposed to low temperature conditions. Of particular interest were the metals and metal oxides which can conduct electricity under certain low temperature conditions with virtually no resistance. These have become known as superconductors. Certain metals, for example, are known to be superconductive when cooled to about 4° on the Kelvin scale (°K.), and certain niobium alloys are known to be superconductive at about 15° K., some as high as about 23° K. More recently, an oxide containing lanthanum, barium, and copper was discovered which became superconductive at temperatures of about 30° K., and in some circumstances, at temperatures of about 20 degrees higher. Current advances have identified materials which become superconductive at temperatures near 100° K., such that liquid nitrogen cooling could be used. Of special interest are ceramic materials which have reduced electrical resistance properties that are stable over time such that they could be developed for use in practical applications. While the phenomena of reduced electrical resistance and even superconductivity has now been observed at liquid nitrogen temperatures or above, these properties are still considered to be achieved primarily at low temperatures when compared to ambient conditions. However, there is some indication that ceramic materials might be formulated which can reliably exhibit reduced electrical resistance and perhaps superconductivity at ambient conditions.

A composition having an approximate unit cell formula of $Y.Ba_2.Cu_3.O_z$, where z is typically about 7, and various related materials, represents a particularly promising group of ceramics for superconducting applications. The compositions are typically formulated from precursors which can be mixed to provide the desired ceramic. In one formulation for these ceramic materials, for example, carbonate and/or oxide powders of the solid elements are mixed and raised to a temperature of about 1,000° C., driving off volatile materials, such as carbon dioxide. The mixture is reground and reheated, ordinarily several times to improve the intimacy of the mixture, and then can be pelletized, sintered for several hours, and then gradually cooled to below 250° C.

Pellets have proven convenient for research applications properly involving ceramic superconductive materials since they can be readily formed by pressing together the powdered materials and binding them by a sintering process. These ceramic materials are typically brittle such that they are also more readily handled in pellet form. However, commercial applications of superconductors are likely to require substantial quantities of such materials in useful shapes such as tubes, rods, wires, or sheets, and other techniques for conveniently and reliably shaping these ceramic materials while maintaining their ability to conduct electricity with reduced resistance are being sought.

Reportedly, one procedure has been developed in which the ceramic powder is encased in a thin tube of metal such as silver, and then drawing the filled tube to form a wire. Evaporative techniques have also been reportedly used to produce films of superconducting materials from multiphase material comprising yttrium, barium, copper, and oxygen. In still another procedure, the ceramic powder, or even its ingredients, are mixed into an organic binder such as polyethylene glycol which is then extruded to form a plastic wire. After the wire is formed into the desired shape, the binder is burnt off and the residual powders are sintered to form the product filament. Tapes have also been produced by embedding ceramic particles in organic material to produce a flexible tape which can be shaped and then sintered. The conductive performance of the final ceramic material is known to be dependent upon the uniformity of element distribution throughout the composition. A common objective in any of the techniques for formulating and processing superconductive materials is to assure intimate mixing of precursor materials to provide a relatively homogeneous ceramic produce.

SUMMARY OF THE INVENTION

Using a novel technique, we coprecipitate our L.M.A. metallic cations as carbonates. This technique provides an initial superior homogeneity of L.M.A., and this homogeneity is maintained throughout subsequent processing steps. The crux of our new technique is our carbonate ion source: viz., a quaternary ammonium carbonate. Use of the quaternaries permits: i) facile pH control (essential for co-precipitation of the carbonates); ii) exclusion of additional metals, such as $K_2CO_3$ as used in prior carbonate processes; iii) ready burn-off of the carbonate source in the furnace; and iv) stoichiometric co-precipitation, without formation of interfering complexes or coordination compounds.

DETAILED DESCRIPTION OF THE INVENTION

Solution A, the Carbonate Reagent

A solution of quaternary ammonium carbonate is conveniently prepared by bubbling $CO_2$, through an aqueous solution of a quaternary ammonium hydroxide until the quaternary carbonate is stoichiometrically formed and $CO_2$ is dissolved in excess. The preferred quaternary ammonium hydroxides have the formula:

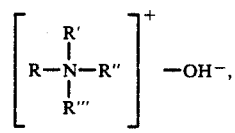

where R, R', R", R'" are the same or different members of the group
i) alkyl, e.g., tetramethylammonium hydroxide, tetraethylammonium hydroxide, tetrapropylammonium hydroxide, dimethyldiethylammonium hydroxide, cyclopropyltrimethylammonium hydroxide and the like;
ii) aromatic, e.g., phenyltrimethylammonium hydroxide, phenylethyldimethylammonium hydroxide, benzyltrimethylammonium hydroxide, and the like;
iii) heterocyclic;
iv) and any two group members may be joined in a ring whereby N becomes a ring member, e.g., dimethyl pyrrolidinium hydroxide, dimethylpyridinium hydroxide, and the like.

Solution B, the Metal Salts

An aqueous solution of the L.M.A. metal salts (as hereinafter defined) is made up by dissolving their nitrates or other water-soluble salts in water, so as to provide the predetermined L.M.A. atomic ratio for the superconductor (e.g. yttrium nitrate, barium nitrate, and copper nitrate may be dissolved in water so that yttrium, barium, and copper ions are present in the solution in a ratio of substantially 1:2:3).

For use in this invention, L is at least one trivalent metal (i.e. valence of +3) such as yttrium or bismuth, and is preferably selected from yttrium, scandium, and the other rare earth group elements (elements with atomic numbers 57-71). M is at least one bivalent metal (i.e. valence of +2) such as Ba or Sr, and is preferably selected from the group Ba, Be, Mg, Ca, and Sr; and A is at least one metal of multiple valency (i.e. more than one valence state) such as Cu or Nb, and is preferably selected from the group Cu, Ag, and Au.

We prefer Y, Ba, and Cu in an atomic ratio of 1:2:3. This results in an amount of oxygen in the calcined product equal to about 7 (or a little less) atoms per atom of Y.

The Co-carbonate Slurry

Solutions A and B are now added slowly, simultaneously, at constant rates, with stirring, to a pool ("heel") of deionized water. This pool is the reaction medium for the carbonate co-precipitation reaction, and the eventual result is a carbonate slurry. Solutions A and B and the heel are suitably each about the same starting volume. The pH should be maintained at about 7.5 or above, suitably between 7.5 and 12, during co-precipitation. For example, the pH of the reaction mass may be maintained at about 7.7-8.0 by drip-wise addition of a quaternary ammonium hydroxide. The precipitated carbonates can be recovered from the slurry using various techniques. On a laboratory scale simple filtration followed by air drying the precipitate is adequate for good homogeneity.

When the carbonate precipitation is complete, the resulting slurry consists essentially of
i) L.M.A. carbonates, about 0.5-75 wt %;
ii) quaternary ammonium cations, about 0.1-75 wt %;
iii) anions residual from the starting L.M.A. salts, stoichiometrically equivalent to the L.M.A. carbonates; and
iv) balance, water.

This novel carbonate-containing slurry is per se an essential part of our invention. The filtered and air-dried precipitate recovered from this slurry is generally friable and easily crumbled.

Calcination

Starting with the direct carbonate precipitate, we calcine according to the following program:
1) The precipitate is placed in an alumina boat, which is then placed in an electric furnace, in flowing air.
2) The furnace is brought up to about 600° C. to 1400° C., the precise calcining temperature range depending upon the metal composition. Generally, the preferred temperature range is from about 850°-1050° C., suitably 950°. The time required to bring the furnace up to temperature is not critical. At least a few minutes is, however, generally necessary, depending on the structure and operation of the furnace.
3) The furnace is maintained at the temperature selected in 2) for about 4-8 hours, suitably about 6 hours.
4) Next, the furnace is gradually cooled over a period of time (linear cooling). This step is important. We prefer to cool down to about room temperature to 250° C. over 5-12 hours, suitably 8 hours. Cooling is preferably accomplished in an atmosphere of $O_2$.

(Comment: At this stage the calcined product—a powder—is superconducting. To facilitate the levitation test, it may be compressed into a wafer.)

We have found that a useful organic-free intermediate can be prepared by heating the dried co-precipitate recovered from the co-carbonate slurry to a temperature sufficient to decompose or otherwise volatilize any remaining quaternary ammonium and nitrate material, and to achieve partial conversion of the carbonates in the co-precipitate to oxides. For example, an yttrium-barium-copper co-precipitate from nitrate salts may be heated to about 540° C to remove quaternary ammonium and nitrate material and to convert yttrium and copper carbonates to their respective oxides. These intermediates are generally powders which can be conveniently stored, shipped, or processed and can be easily transformed to superconductors by the calcination procedure as described above.

Mention may be made of certain references in the literature.

Wu et al, Superconductivity at 93K in a New Mixed Phase Y-Ba-Cu-O Compound System at Ambient Pressure, Physical Review Letters, 58, 908-910 (Mar. 2, 1987) discloses making the title compounds by solid state reaction of $Y_2O_3$, $BaCO_3$, and CuO.

Engler et al, Superconductivity above Liquid Nitrogen Temperature: Preparation and Properties of a Family of Perovskite-Based Superconductors, J. Am. Chem. Soc. 109, 2848-2849 (1987), mixes $Y_2O_3$, $BaCO_3$, and CuO in a ball mill to give a 1:2:3 ratio of Y, Ba, Cu. The powder was heated in an alumina boat at 950° C., and the resulting black powder was reground and heated again.

Wang et al, Comparison of Carbonate, Citrate, and Oxalate Chemical Routes to the High-$T_c$ Metal Oxide Superconductors $La_{2-x}Sr_xCuO_4$, Inorg. Chem. 26, 1474-1476 (1987). This was the only reference we found using a carbonate precipitation technique. The precipitant was $K_2CO_3$. According to the paper, it was necessary to wash the precipitate repeatedly, an obvious disadvantage in production work. Washing was necessary because potassium adversely affects superconductivity properties of the finished material. If we wash repeatedly, we remove barium, a highly detrimental loss in our process.

From the technical viewpoint it may seem obvious that co-precipitated carbonates would provide enhanced homogeneity. However, the technical solution to the problem proved frustrating and was marked by an initial series of failures. We noted that the Wang et al process, using potassium carbonate (or sodium carbonate) necessitated numerous washings and apparently left detectable amounts of alkali in the ceramic base even so. As noted, serial washings remove Ba, and would be unworkable in our process. We looked for a carbonate that would burn off completely, and for this we tried ammonium carbonate. Here we found that we had to use a pH below 7 to prevent formation of copper tetraamine but that under these conditions $HCO_3^-$ ion was formed, and that barium bicarbonate, being slightly soluble, was formed and disrupted our desired stoichiometry. Oxalates looked interesting, but we found that these form oxalate complexes with yttrium that retain it in solution. Our research in this area was finally capped with the quaternary ammonium carbonates, as above described. These compounds, so far as our work to date shows, form the desired metal carbonates simply and cleanly, without troublesome side-formation of complexes or coordination compounds, with firm and precise retention of the intended stoichiometry; which do not interfere with filtration, or similar recovery operations; which do not introduce contaminants into the final product; and which result in homogeneous particles that do not require grinding. The reaction in the reaction mixture is of course ionic, that is, carbonate ions react with the respective metal ions to form the respective metal carbonate precipitate.

The following examples illustrate without limiting the invention.

EXAMPLE 1

Carbon dioxide (from dry ice) was bubbled through 0.405 moles of 40 wt % tetraethylammonium (TEA) hydroxide until the pH was 8.3 to form $TEA_2CO_3$ and/or $TEAHCO_3$. The solution was diluted to 250 cc. 0.016 moles yttrium nitrate, 0.032 moles barium nitrate, and 0.048 moles copper nitrate were dissolved in deionized water to make 250 cc solution. The two solutions were slowly dripped into a heel of 300 cc deionized water with stirring. The pH was maintained at about 7.7-8.0 by the dropwise addition of a solution of TEAOH (40 wt %). The TEAOH solution had a pH of 14-15. The light blue precipitate was filtered, then dried at 110° C. overnight and fired in flowing air. The firing program involved a ramp to 950° C. over 6 hours, maintaining 950° C. for 6 hours, then linearly cooling to 150° C. over 8 hours. The resulting black solid, when compressed (180001bf, $\frac{3}{4}$"-diameter die) into a wafer, could levitate a magnet at liquid nitrogen temperatures. Other products have been made on a larger scale using tetramethyl ammonium hydroxide (TMA) as the quaternary ammonium compound and cooling under oxygen following calcination in air at about 920° C.

$\Delta T_c$

Our superconducting ceramic product shows a relatively narrow $\Delta T_c$, indicating a high degree of purity and homogeneity. By "Delta $T_c$" we mean the width of the resistivity curve as it leaves the zero resistivity line at some particular temperature, Tc rises (generally sharply) with rising temperature (indicating increasing resistivity and loss of superconductivity) and then levels off asymptotically at another particular temperature, indicating complete or substantially complete loss of superconductivity and entry of the ceramic into the world of normal resistance/conductivity.

Extraneous Materials

We have mentioned that prior art processes conventionally enhance homogeneity by grinding the calcined superconductor, followed by recalcining. In some instances this sequence may be repeated several times. It is known that improved homogeneity in the general case enhances superconductivity. The problem here is that effective grinding inevitably and inherently introduces trace impurities into the ceramic, simply by impacting the ceramic between the balls and walls (or other grinding surfaces) of the grinding mill. It is known, for example, that silica or stainless steel balls in a ball mill lose significant mass over a period of use. This mass of course disappears into whatever was being milled. Mills that comminute by particle self-impact lose metal by wall-scouring, particularly in the area of stream entry.

Thus, the firing-grinding-refiring technique rapidly achieves a balance: improvement in homogeneity tends to be matched by contamination build-up that cancels part or all of the improvement.

Our process, by achieving ultimate homogeneity in the first place, avoids the grinding problem altogether. Our product can, of course, be subjected to the conventional firing-grinding-refiring cycle, but this is not our preferred technique. Our process works best, and our best superconductors are obtained, when no extraneous materials are introduced into the material at any stage. By "extraneous materials" we mean materials (other than those which can be volatilized during calcination) introduced into the base metal solution to precipitate the carbonates, e.g., potassium carbonate to precipitate Y, Ba, and Cu carbonates. The term also includes contaminants (generally metals or metal oxides) introduced into the composition by grinding the L.M.A.D. composite. If the product is ground in a ball mill using quartz or silica balls, some of the impurity is silica.

Levitation Test for Superconductivity

Various tests are available for the determination of superconductivity. One of these tests is conventional, simple, and is accepted in the art as definitive. We used this, the so-called levitation test, in our determinations, and we describe it below.

A circular wafer of the compound is prepared by calcining and compressing as described in Example 1. The wafer is about 1-inch in diameter and about 3/16-inch thick. It is placed in the center of a glass dish, and then liquid nitrogen (77° K.) is poured into the dish.

The wafer bubbles a bit at first, as the nitrogen boils on contact, and as surface air is flushed from the wafer. In a few minutes gas evolution diminishes to nearly zero, and the wafer may be assumed to be chilled to approximately the temperature of liquid nitrogen. A chip of a rare earth magnet is now dropped gently over the wafer. If the magnet levitates, i.e., hovers in the air over the wafer, the wafer is superconducting. (Comment: Instances have been reported where the magnet sank; yet measurable superconductivity existed and was detectable by more sophisticated means. But a positive test, such as we achieved in our runs, shows certain superconductivity.)

We claim:

1. Process comprising introducing simultaneously into a stirred reaction medium comprising a pool of water a first solution comprising carbonate ions from quaternary ammonium carbonate, and a second solution comprising L.M.A. metal ions to form a slurry comprising precipitates of the respective metal carbonates, and recovering and drying the precipitates; L being at least one trivalent metal, M being at least one bivalent metal, and A being at least one metal of multiple valency; and L, M, and A being present in a predetermined atomic ratio for a superconductor.

2. Process according to claim 1 wherein following drying the precipitate, the precipitate is heated to a temperature sufficient to decompose or otherwise volatilize any remaining quaternary ammonium and nitrate material and to achieve partial conversion of carbonates in the co-precipitate to oxides.

3. Process according to claim 2 wherein L is at least one metal of the rare earth group, including scandium and yttrium; M is at least one metal of the group Ba, Mg, Ca, and Sr; A is at least one metal of the group Cu and Ag.

4. Process according to claim 1 wherein L is at least one metal of the rare earth group including scandium and yttrium; M is at least one metal of the group Ba, Mg, Ca, and Sr; and A is at least one metal of the group Cu and Ag.

5. Process according to claim 4, wherein, following drying the precipitate, the precipitate is calcined to an initial temperature of about 850°–1050° C.; held at that temperature for about 4–8 hours; and linearly cooled down to a temperature in the range of about room temperature to 250° C. over about 5–12 hours, thereby forming a superconducting material.

6. Process according to claim 4 wherein carbon dioxide is passed through aqueous tetraethylammonium hydroxide to a pH of 8.3 to form tetraethylammonium carbonate plus dissolved carbon dioxide; adding the said tetraethylammonium carbonate to an aqueous solution of nitrates of yttrium, barium, and copper in a Y:Ba:Cu atomic ratio of 1:2:3 at a pH of about 7.7–8.0, thereby to precipitate the said Y, Ba, and Cu as carbonates; recovering and drying the precipitate; calcining the dried precipitate at about 950° C. and cooling the calcined product to about 150° C. over 8 hours.

7. Process according to claim 4 wherein the pH of the reaction medium is maintained at about 7.5–12 during co-precipitation.

8. Process according to claim 4 wherein the pH of the reaction medium is maintained at about 7.7–8.0 during co-precipitation.

9. Process according to claim 4 wherein the metal ions are derived from metal nitrates.

10. Process according to claim 4 wherein the quaternary ammonium carbonate is prepared by bubbling $CO_2$, through an aqueous solution of a quaternary ammonium hydroxide until the quaternary carbonate is stoichiometrically formed and $CO_2$ is dissolved in excess, said quaternary ammonium hydroxide having the formula:

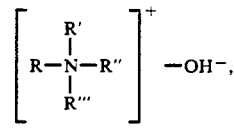

where R, R', R", R''' are the same or different members of the group i) alkyl, e.g., tetramethylammonium hydroxide, tetraethylammonium hydroxide, tetrapropylammonium hydroxide, dimethyldiethylammonium hydroxide, cyclopropyltrimethylammonium hydroxide and the like;

ii) aromatic, e.g., phenyltrimethylammonium hydroxide, phenylethyldimethylammonium hydroxide, benzyltrimethylammonium hydroxide, and the like;

iii) heterocyclic;

iv) and any two group members may be joined in a ring whereby N becomes a ring member, e.g., dimethyl pyrrolidinium hydroxide, dimethylpyridinium hydroxide, and the like.

11. Process according to claim 4 wherein L.M.A. is $Y.Ba_2Cu_3$ and quaternary ammonium carbonates tetramethylammonium carbonate or tetraethylammonium carbonate.

12. Process according to claim 11, wherein, following drying the precipitate, the precipate is calcined to an initial temperature of about 850°–1050°; held at that temperature for about 4–8 hours; and linearly cooled down to a temperature in the range of about room temperature to 250° C. over about 5–12 hours, thereby forming a superconducting material.

13. Aqueous slurry consisting essentially of homogeneous dispersion of L.M.A. carbonates and quaternary ammonium salts, where L is at least one trivalent metal, M is at least one bivalent metal; and A is at least one metal of multiple valency.

14. The aqueous slurry of claim 13 wherein L is at least one metal of the rare earth group including scandium and yttrium; M is at least one metal of the group Ba, Be, Mg, Ca, and Sr; and A is at least one metal of the group Cu and Ag.

15. Slurry according to claim 13 wherein L.M.A. is Y.Ba.Cu in an atomic ratio of 1:2:3.

16. Aqueous slurry according to claim 15 consisting essentially of i) L.M.A. carbonates, about 0.5–75 wt %;

ii) quaternary ammonium cations, about 0.1–75 wt %;

iii) anions residual from the starting L.M.A. salts, stoichiometrically equivalent to the L.M.A. carbonates; and iv) balance, water.

* * * * *